United States Patent
Toshima et al.

(10) Patent No.: US 11,158,492 B2
(45) Date of Patent: Oct. 26, 2021

(54) FILM FORMING APPARATUS AND FILM FORMING METHOD

(71) Applicant: Tokyo Electron Limited, Tokyo (JP)

(72) Inventors: Hiroyuki Toshima, Yamanashi (JP); Hiroyuki Iwashita, Yamanashi (JP); Tatsuo Hirasawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 95 days.

(21) Appl. No.: 16/521,825

(22) Filed: Jul. 25, 2019

(65) Prior Publication Data

US 2020/0043711 A1    Feb. 6, 2020

(30) Foreign Application Priority Data

Jul. 31, 2018  (JP) .............................. JP2018-144448

(51) Int. Cl.
*H01J 37/34* (2006.01)
*C23C 14/34* (2006.01)
(Continued)

(52) U.S. Cl.
CPC ...... *H01J 37/3441* (2013.01); *C23C 14/3407* (2013.01); *C23C 14/505* (2013.01); *H01J 37/3435* (2013.01); *H01L 21/02266* (2013.01)

(58) Field of Classification Search
CPC .............. H01J 37/3441; H01J 37/3435; H01J 37/32633; H01J 37/3447; H01J 37/32651;
(Continued)

(56) References Cited

U.S. PATENT DOCUMENTS 4,924,807 A  *  5/1990  Nakayama .............. C23C 16/455
                                                       118/50.1
6,217,730 B1    4/2001  Nakajima et al.
(Continued)

FOREIGN PATENT DOCUMENTS

JP          06-041733 A        2/1994
JP          06041733 A   *    2/1994   ......... C23C 14/0068
(Continued)

OTHER PUBLICATIONS

JP-2015064531-A Machine Translation (Year: 2015).*
WO-2007111097-A1 Machine Translation (Year: 2007).*
JP-2015030906-A Translation (Year: 2015).*

*Primary Examiner* — James Lin
*Assistant Examiner* — Patrick S Ott
(74) *Attorney, Agent, or Firm* — Abelman, Frayne & Schwab

(57) ABSTRACT

A film forming apparatus for forming a film by reactive sputtering includes a processing chamber, a sputter mechanism, a sputtered particle shielding member, a reaction chamber, a substrate support, a substrate moving mechanism, a sputtered particle passage hole, and a reactive gas introducing unit. While moving a substrate by the substrate moving mechanism, sputtered particles, that are released to the discharge space by the sputter mechanism and pass through the sputtered particle passage hole to be injected to the reaction chamber, are reacted with a reactive gas introduced into the reaction chamber, and a reactive sputtering film generated by the reaction is formed on the substrate.

18 Claims, 4 Drawing Sheets

(51) Int. Cl.
*C23C 14/50* (2006.01)
*H01L 21/02* (2006.01)

(58) Field of Classification Search
CPC ........... H01L 21/02266; C23C 14/3407; C23C 14/505; C23C 14/225; C23C 14/35; C23C 14/50; C23C 14/0063; C23C 14/04; C23C 14/042; C23C 14/044
USPC ........... 204/298.11, 298.28, 298.07; 118/730
See application file for complete search history.

(56) References Cited

U.S. PATENT DOCUMENTS

| | | | | |
|---|---|---|---|---|
| 6,296,747 | B1 * | 10/2001 | Tanaka | C23C 14/345 |
| | | | | 204/298.07 |
| 2002/0003086 | A1 * | 1/2002 | Sferlazzo | C23C 14/044 |
| | | | | 204/298.11 |
| 2006/0054494 | A1 * | 3/2006 | Reiss | H01J 37/3447 |
| | | | | 204/192.12 |
| 2011/0147199 | A1 * | 6/2011 | Ohishi | C23C 14/34 |
| | | | | 204/192.12 |
| 2013/0299345 | A1 * | 11/2013 | Endo | H01J 37/3435 |
| | | | | 204/298.11 |
| 2014/0141624 | A1 * | 5/2014 | Abarra | H01J 37/3447 |
| | | | | 438/778 |

FOREIGN PATENT DOCUMENTS

| | | | | |
|---|---|---|---|---|
| JP | 2005-042200 A | | 2/2005 | |
| JP | 2015030906 A | * | 2/2015 | ............ H01J 37/345 |
| JP | 2015-064531 A | | 4/2015 | |
| JP | 2015-067856 A | | 4/2015 | |
| JP | 2015064531 A | * | 4/2015 | |
| JP | 2015067856 A | * | 4/2015 | |
| WO | WO-2007111097 A1 | * | 10/2007 | ............ C23C 14/50 |

\* cited by examiner

FILM FORMING APPARATUS AND FILM FORMING METHOD

CROSS-REFERENCE TO RELATED APPLICATIONS

This application is based on and claims priority from Japanese Patent Application No. 2018-144448 filed on Jul. 31, 2018 with the Japan Patent Office, the disclosure of which is incorporated herein in its entirety by reference.

TECHNICAL FIELD

The present disclosure relates to a film forming apparatus and a film forming method.

BACKGROUND

In manufacturing electronic devices such as semiconductor devices, a film forming process that forms a film on a substrate is performed.

As a film forming process, a reactive sputtering is known in which sputtered particles released from a target and a reactive gas such as oxygen or nitrogen are reacted to form a compound thin film such as an oxide film or a nitride film on a substrate (e.g., Japanese Patent Laid-open Patent Publication Nos. 06-041733 and 2005-042200).

SUMMARY

A film forming apparatus according to one aspect of the present disclosure is a film forming apparatus including: a processing chamber in which a film forming process is performed on a substrate; a sputter configured to release sputtered particles from a target in the processing chamber; a sputtered particle shield configured to shield a discharge space to which the sputtered particles released by the sputter are released; a reaction chamber provided separately from the discharge space in the processing chamber; a substrate support configured to support the substrate in the reaction chamber; a substrate mover configured to move the substrate supported by the substrate support; a sputtered particle passage hole provided in the sputtered particle shield, having an area smaller than that of the substrate, and configured to pass the sputtered particles toward the substrate in the reaction chamber; and a reactive gas introducing port configured to introduce a reactive gas into the reaction chamber. The sputtered particles are released to the discharge space by the sputter while moving the substrate by the substrate mover, ejected into the reaction chamber through the sputtered particle passage hole, and reacted with the reactive gas introduced into the reaction chamber, thereby forming a reactive sputtering film on the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

First Embodiment

First, a first embodiment will be described.

Figure 1:
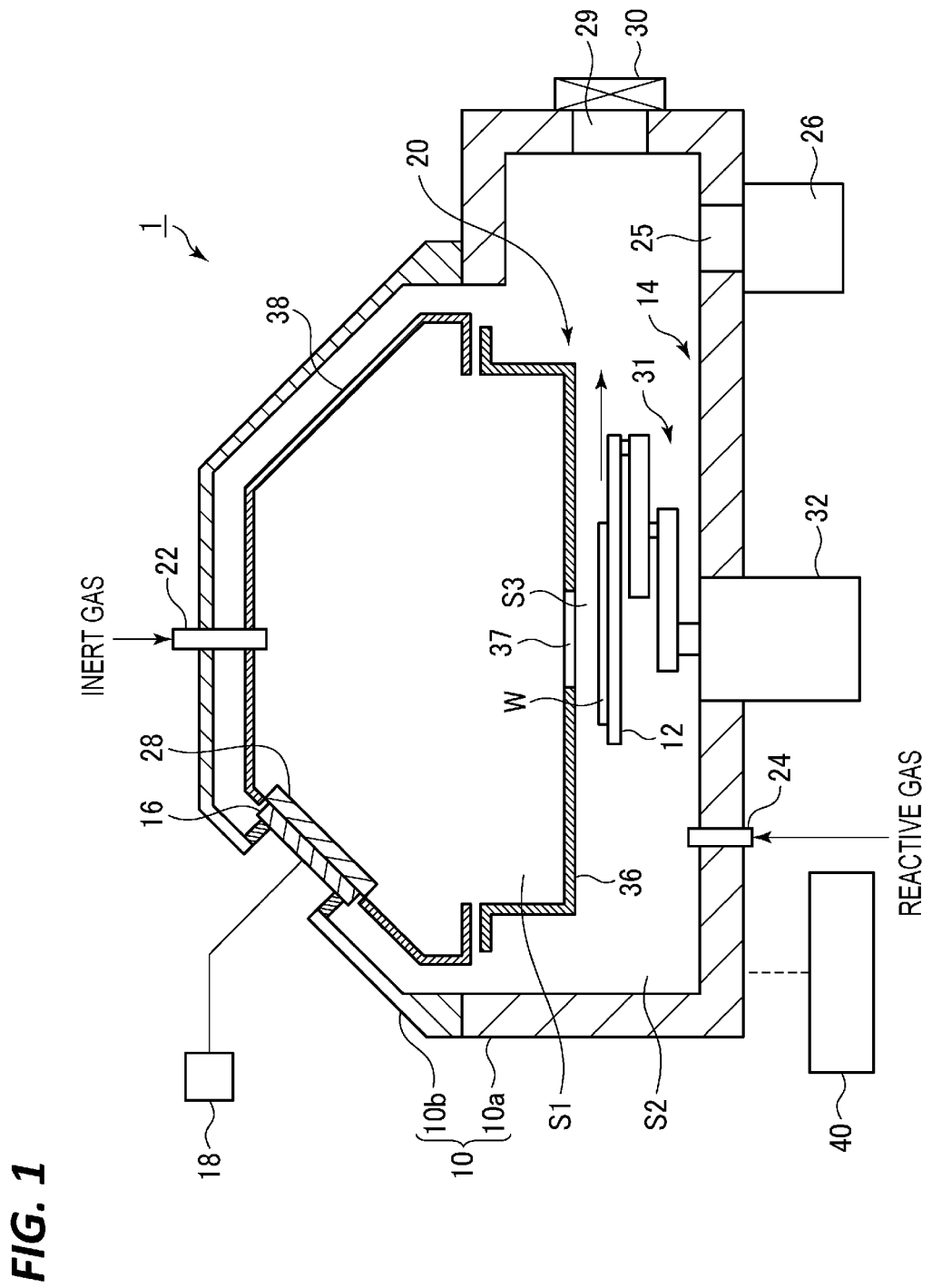
FIG. 1 is a longitudinal cross-sectional view illustrating a film forming apparatus according to a first embodiment.

FIG. 1 is a longitudinal cross-sectional view illustrating a film forming apparatus according to the first embodiment.

A film forming apparatus 1 of the present embodiment is to form a film by a reactive sputtering on a substrate W. The film forming apparatus 1 includes a processing chamber 10, a substrate support 12, a substrate moving mechanism 14, a target holder 16, a power supply 18, a sputtered particle shielding member 20, a sputtering gas introducing unit 22, a reactive gas introducing unit 24, and an exhaust device 26. For example, a semiconductor wafer may be used as the substrate W, but the present disclosure is not limited thereto.

The processing chamber 10 includes a chamber body 10a that is opened at its upper portion, and a cover 10b that is provided so as to close the upper opening of the chamber body 10a. The cover 10b forms a trapezoidal shape in cross section.

An exhaust port 25 is formed at the bottom of the processing chamber 10, and the exhaust device 26 is connected to the exhaust port 25. The exhaust device 26 includes a pressure control valve and a vacuum pump, and the inside of the processing chamber 10 is evacuated to a predetermined vacuum degree by the exhaust device 26.

A carrying-in/out port 29 for carrying-in/out the substrate W to/from a conveyance chamber (not illustrated) is formed on the side wall of the processing chamber 10. The carrying-in/out port 29 is opened/closed by a gate valve 30.

The substrate support 12 is provided in the chamber body 10a of the processing chamber 10, and is configured to horizontally support the substrate W. The substrate support 12 is configured to be movable linearly in the horizontal direction by the substrate moving mechanism 14. Therefore, the substrate W supported by the substrate support 12 moves linearly in a horizontal plane by the substrate moving mechanism 14. The substrate moving mechanism 14 includes an articulated arm 31 and a drive unit 32, and the substrate support 12 is configured to be movable in the horizontal direction by driving the articulated arm 31 by the drive unit 32.

The sputtering gas introducing unit 22 is provided at the top of the processing chamber 10. An inert gas such as Ar gas or Kr gas serving as the sputtering gas is introduced into the processing chamber 10 from the sputtering gas introducing unit 22.

The target holder 16 holds a target 28, is formed of a conductive material, and is attached obliquely to the substrate W, on an inclined surface of the cover 10b of the processing chamber 10 through an insulating member. The target 28 is made of a material containing a constituent element of a film to be formed. For example, when the film to be formed is a TiN film, the target 28 is made of Ti.

The power supply 18 is electrically connected with the target holder 16. The power supply 18 may be a DC power supply in a case where the target 28 is made of a conductive material, and may be a radio-frequency power supply in a case where the target 28 is made of a dielectric material. When the power supply 18 is the radio-frequency power supply, the power supply 18 is connected to the target holder 16 via a matching device. By applying a voltage to the target holder 16, the inert gas that serves as the sputtering gas introduced from the sputtering gas introducing unit 22 is dissociated around the target 28. Then, ions in the dissociated gas collide with the target 28, so that sputtered particles, which are particles of the constituent material of the target 28, are released obliquely downward from the target 28.

The target holder 16, the power supply 18, and the sputtering gas introducing unit 22 constitute a sputter mechanism that releases sputtered particles from the target 28.

The reactive gas introducing unit 24 is provided at the bottom of the processing chamber 10. The reactive gas introducing unit 24 introduces, for example, a reactive gas such as $O_2$ gas or $N_2$ gas into the processing chamber 10. The reactive gas reacts with the sputtered particles released from the target 28 to form a predetermined compound film on the surface of the substrate W on the substrate support 12. For example, when the target 28 is Ti and the reactive gas is $N_2$ gas, a TiN film is formed.

The sputtered particle shielding member 20 is provided in the processing chamber 10, has a function of shielding the sputtered particles released from the target 28, and includes a sputtered particle shielding plate 36, a shielding member 38, and a sputtered particle passage hole 37.

The sputtered particle shielding plate 36 has a substantially plate-like shape, is horizontally provided immediately above the substrate support 12, and is formed with the sputtered particle passage hole 37. The sputtered particle passage hole 37 penetrates in the thickness direction of the sputtered particle shielding plate 36. The shielding member 38 is provided above the sputtered particle shielding plate 36. Then, a shielded space is formed by the sputtered particle shielding plate 36 and the shielding member 38, and the space serves as a discharge space S1 to which the sputtered particles are released from the target 28. A clearance of about 1 to 2 mm is formed between the sputtered particle shielding plate 36 and the shielding member 38, and a labyrinth structure is formed.

A region in the processing chamber 10 in which the substrate W is disposed and the reactive gas and the sputtered particles react with each other serves as a reaction chamber S2 which is separated from the discharge space S1. Then, the sputtered particle passage hole 37 allows the sputtered particles in the discharge space S1 to pass therethrough toward the substrate W in the reaction chamber S2. Pressure of the discharge space S1 and the reaction chamber S2 may be independently controlled by adjusting, for example, the flow rates of the inert gas serving as the sputtering gas and the reactive gas.

The sputtering gas introducing unit 22 is configured to supply the sputtering gas to the discharge space S1, and the reactive gas introducing unit 24 is configured to supply the reactive gas to the reaction chamber S2.

In the shielded discharge space S1, the sputtered particles are released obliquely downward from the target 28, pass through the sputtered particle passage hole 37, and are obliquely irradiated to the substrate present in the reaction chamber S2.

Figure 2:
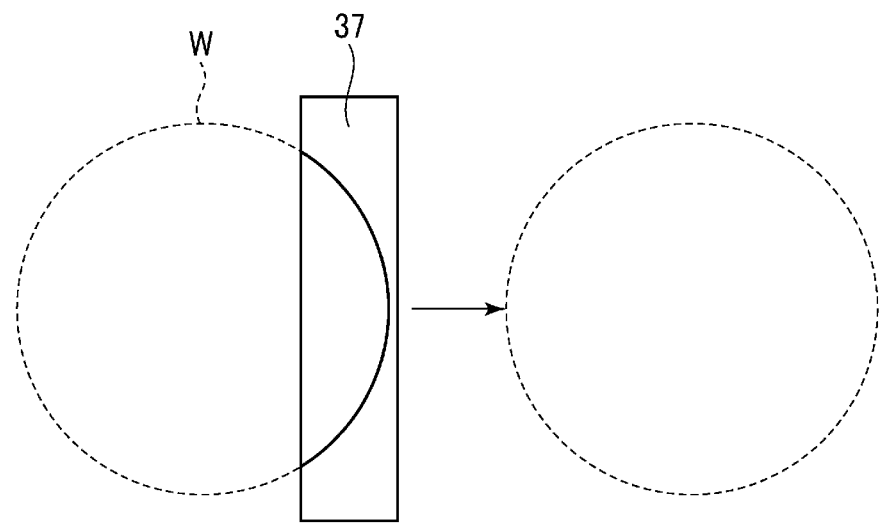
FIG. 2 is a view illustrating a relationship between a sputtered particle passage hole and a substrate of the film forming apparatus in FIG. 1.

The sputtered particle passage hole 37 has an area smaller than that of the substrate W, and is configured to be difficult that the reactive gas enters into the discharge space S1. The area of the sputtered particle passage hole 37 may be 90% or less of the area of the substrate W, further, may be 10 to 90%, still further, may be 10 to 50% of the area of the substrate W. When the substrate W moves straight as in the example, as illustrated in FIG. 2, the shape of the sputtered particle passage hole 37 may be a rectangle having a length equal to or greater than the diameter (width) of the substrate W.

Meanwhile, in the reaction chamber S2, between the sputtered particle passage hole 37 and the substrate W, the sputtered particles fall from the discharge space S1, and at the same time, the reactive gas is supplied thereto so that a reaction space S3 is formed in which the reaction between the sputtered particles and the reactive gas occurs. A compound to be formed into a film is generated by the reaction in the reaction space S3, and a reactive sputtering film made of the compound is formed on the substrate W.

At this time, the distance between the sputtered particle shielding plate 36 and the substrate W may be a distance capable of supplying the reactive gas to the reaction space S3 with a sufficiently large conductance. As a result, the reactivity of the sputtered particle and the reactive gas in the reaction space S3 may be improved. In this point of view, the distance between the sputtered particle shielding plate 36 and the substrate W may be 2 mm or more, and further, may be 4 mm or more.

Further, the portion of the sputtered particle shielding plate 36 other than the sputtered particle passage hole 37 has a function of a rectifying plate that rectifies the reactive gas, and the reactive gas may be stably supplied onto the substrate W in a laminar flow state.

The film forming apparatus 1 further includes a controller 40. The controller 40 is constituted by a computer, and includes a main controller constituted by a CPU that controls respective components of the film forming apparatus 1, for example, the power supply 18, the introduction of the sputtering gas, the introduction of the reactive gas, the exhaust device 26, and the drive mechanism 32 or the like. Further, additionally, the controller 40 includes an input device such as a keyboard and a mouse, an output device, a display device, and a storage device. By setting a storage medium that stores a processing recipe in the storage device, the main controller of the controller 40 causes the film forming apparatus 1 to execute a predetermined operation based on the processing recipe loaded from the storage medium.

Subsequently, the operation of the film forming apparatus that is configured as described above will be explained.

First, the gate valve 30 is opened so as to carry the substrate into the reaction chamber S2 in the processing chamber 10 by the conveying device (not illustrated) from the conveyance chamber (not illustrated) adjacent to the processing chamber 10, and to dispose on the substrate support 12.

Next, the pressure of the interior of the processing chamber 10 is regulated to a predetermined pressure while introducing an inert gas such as Ar gas or Kr gas as a sputtering gas into the discharge space S1 in the processing chamber 10 from the sputtering gas introducing unit 22.

Next, the reactive gas is introduced into the reaction chamber S2 in the processing chamber 10 from the reactive gas introducing unit 24 at the same time applying a voltage to the target holder 16 from the power supply 18, while linearly moving the substrate W disposed on the substrate support 12 in the horizontal plane by the substrate moving mechanism 14.

Figure 3:
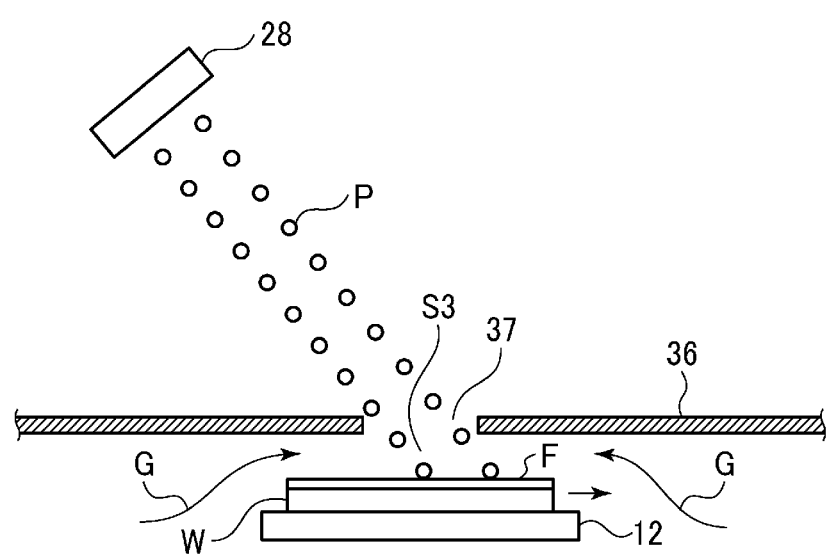
FIG. 3 is a schematic view for describing an aspect for forming a film according to the first embodiment.

At this time, the sputtering gas introduced from the sputtering gas introducing unit 22 is dissociated by the electromagnetic field formed by applying a voltage to the target holder 16. Then, ions in the dissociated gas collide with the target 28, so that sputtered particles of the constituent material of the target 28 are released obliquely downward from the target 28. As illustrated in FIG. 3, sputtered particles P released from the target 28 pass through the sputtered particle passage hole 37 to be injected to the reaction chamber S2, and are irradiated to the substrate W. Meanwhile, a reactive gas G introduced into the processing chamber 10 from the reactive gas introducing unit 24 is diffused in the processing chamber 10, and when the reactive gas G reaches the reaction space S3 in which the sputtered particles P fall from the sputtered particle passage hole 37 to the substrate, the reactive gas G reacts with the sputtered particles P to form a compound to be formed into a film, and a reactive sputtering film F made of the compound is formed on the substrate W.

In a reactive sputtering apparatus of the related art, a reactive gas is often supplied to a discharge space to which sputtered particles are released. In this case, the discharge space is covered with a shield in general, and the shield is provided with a clearance for introducing the reactive gas. However, from a viewpoint of suppressing the leakage of sputtered particles, when the clearance is made small, the reactive gas does not easily enter the discharge space and the control becomes difficult, so the process margin tends to be narrowed. In contrast, when the reactive gas sufficiently enters to the discharge space, the reactive gas is excessively supplied and reacts up to the target surface, so that problems such as a decrease in film forming rate or generation of dust (particles) (Poisson Poison Mode) are caused.

Further, in the reactive sputtering apparatus of the related art, the reactive sputtering film is also deposited on the shield portion (e.g., inside of the sputtered particle shielding member 20) around the substrate. Generally, since a reactive sputtering film has a large film stress and is easily peeled off, when the reactive sputtering film is also deposited on the shield portion around the substrate, problems such as generation of dust (particles) are caused, and thus, the maintenance cycle becomes short.

According to the techniques disclosed in Japanese Patent Laid-open Publication Nos. 06-041733 and 2005-042200, the differential pressure plate and the partition plate suppress the reactive gas from entering the discharge space, and make it difficult for the reactive gas to reach the target. However, the sputtered particle passage hole formed in the differential pressure plate and the partition plate are larger than the substrate, and the penetration of the reactive gas into the discharge space may not necessarily be effectively suppressed.

In this regard, in the present embodiment, while moving the substrate W linearly, the sputtered particles from the discharge space S1 pass through the sputtered particle passage hole 37 that is smaller than the area of the substrate W, and are reacted with the reactive gas in the reaction space S3 outside the discharge space S1.

As a result, the reactive gas does not have to be supplied to the discharge space with a small conductance, and the reactive gas may be supplied to the substrate W with a sufficiently large conductance, and thus, it is possible to widen the process margin. Further, since the substrate W is moved in a state where the area of the sputtered particle passage hole 37 is smaller than the substrate, the reactive gas hardly flows into the discharge space, and the reaction between the target and the reactive gas may be suppressed. At this time, the area of the sputtered particle passage hole 37 may be 90% or less of the area of the substrate W, further, may be 10 to 90%, still further, may be 10 to 50% of the area of the substrate W. Further, since the reactive gas is supplied to the sputtered particles that pass through the sputtered particle passage hole 37 from the discharge space S1 and fall to the reaction space S3, the reactive gas is further less likely to penetrate to the discharge space, and the reaction between the target and the reactive gas may be prevented more reliably.

By separating the discharge space and the reaction space, it is prevented that the sputtered particles and the reactive gas are reacted with each other and the reactive sputtering film is deposited on the shield portion (e.g., the sputtered particle shielding member 20) around the substrate. Therefore, the generation of dust (particles) on the shield portion around the substrate is suppressed, and the problem of shortening the maintenance cycle does not occur.

Further, as in the present embodiment, when the discharge space S1 shielded by the sputtered particle shielding member 20 is separately partitioned in the processing chamber 10, the following effects may be achieved by changing the volume of the discharge space S1. That is, when the discharge space S1 is not partitioned, the shape and the volume of the processing chamber 10 is fixed, and thus, the sputtered particles may not be released under optimal conditions depending on the requirements such as the type of the film or the film thickness. In this case, it is difficult to change the shape or the volume of the processing chamber 10. In this regard, by changing the volume of the discharge space S1 in the processing chamber 10, it is possible to easily change the pressure around the target, the gas concentration of the sputtering gas or the like. Therefore, it is possible to release the sputtered particles under the optimal conditions without changing the shape of the processing chamber.

Further, by setting the distance between the sputtered particle shielding plate 36 and the substrate W to be a distance capable of supplying the reactive gas to the reaction space S3 with a sufficiently large conductance, the reactivity between the sputtered particles and the reactive gas in the reaction space S3 may be improved. In this point of view, the distance between the sputtered particle shielding plate 36 and the substrate W may be 2 mm or more, and further, may be 4 mm or more.

Further, since the portion of the sputtered particle shielding plate 36 other than the sputtered particle passage hole 37 functions as a rectifying plate that guides the reactive gas to the reaction space S3, the reactive gas may be stably supplied onto the substrate W in a laminar flow state.

Further, in the present embodiment, the shape of the sputtered particle passage hole 37 is a rectangle having a length equal to or greater than the diameter (width) of the substrate W, and the sputtered particles are obliquely irradiated to the substrate W from the target 28 and reacted with the reactive gas while linearly moving the substrate W. Therefore, it is possible to perform an oblique film formation with high directivity by making the angle of the sputtered particles substantially constant.

Second Embodiment

Next, a second embodiment will be described.

Figure 4:
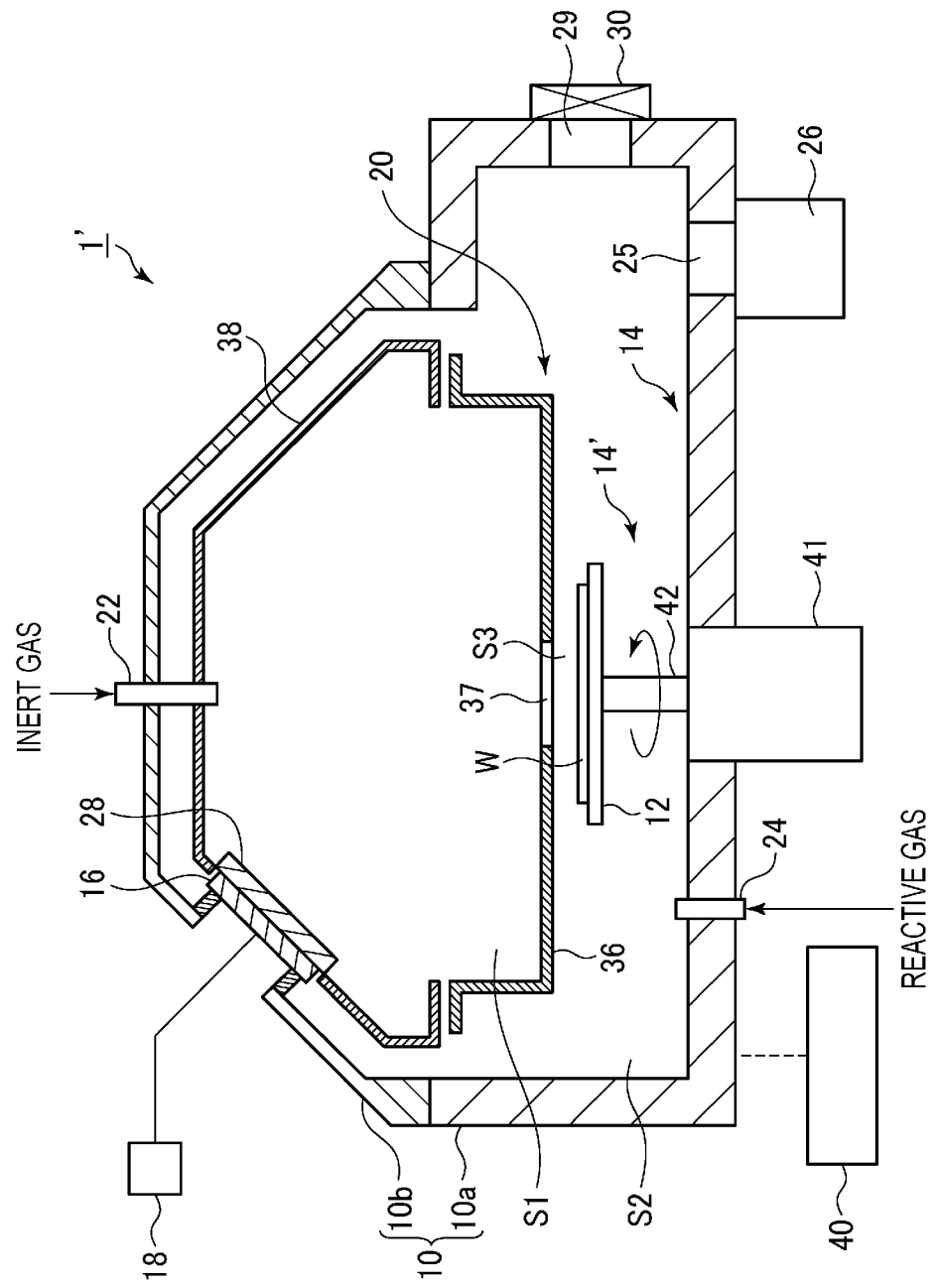
FIG. 4 is a longitudinal cross-sectional view illustrating a film forming apparatus according to a second embodiment.

FIG. 4 is a longitudinal cross-sectional view illustrating a film forming apparatus according to the second embodiment.

The film forming apparatus 1' of the present embodiment is configured in the same manner as the film forming apparatus 1 illustrated in FIG. 1, except that a substrate moving mechanism 14' is provided instead of the substrate moving mechanism 14.

The substrate moving mechanism 14' includes a rotation drive unit 41 and a rotation shaft 42, and the rotation shaft 42 is fixed to the center of the substrate support 12. Therefore, the substrate support 12 is rotated via the rotation shaft 42 by the rotation drive unit 41, thereby the substrate W above is rotated in a horizontal plane.

In the present embodiment, the reactive sputtering is performed in the same manner as in the first embodiment while the substrate W is rotationally moved by the substrate moving mechanism 14'.

Figure 5:
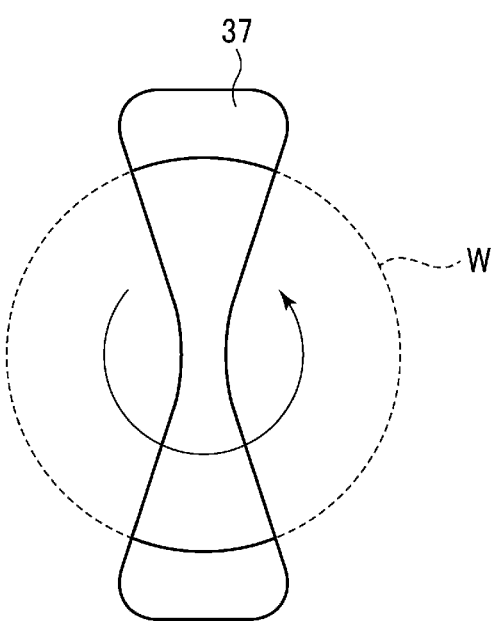
FIG. 5 is a view illustrating a relationship between a sputtered particle passage hole and a substrate of the film forming apparatus in FIG. 4.

In the present embodiment, the shape of the sputtered particle passage hole 37 formed in the sputtered particle shielding plate 36 may have a shape which is wide at the outer peripheral portion of the substrate W, and narrow at the center portion of the substrate W, as illustrated in FIG. 5. As a result, the sputtered particles may be supplied more uniformly at the outer peripheral portion and the center portion of the substrate.

Also in the present embodiment, as in the first embodiment, it is possible to widen the process margin and also to make difficult to occur the reaction with the reactive gas in the discharge space. Further, other effects of the first embodiment may be similarly exhibited.

Other Applications

For example, the method of releasing the sputtered particles in the above embodiment is an example, and the sputtered particles may be released by other methods. Further, the above embodiment illustrates the example in which the target is obliquely disposed to perform the oblique film formation. However, the present disclosure is not limited thereto, and the target may be disposed centrally. In the above embodiment, the movement of the substrate in the horizontal plane has been described as a linear movement and rotation as an example, but other movements such as swinging may be used.

According to the present disclosure, a film forming apparatus and a film forming method using reactive sputtering are provided in which the process margin is wide, and also the reaction with the reactive gas hardly occurs in the discharge space.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A film forming apparatus comprising:
a processing chamber in which a film forming process is performed on a substrate;
a sputtering assembly configured to release sputtered particles from a target in the processing chamber;
a sputtered particle shield configured to shield a discharge space to which the sputtered particles released by the sputtering assembly are released;
a reaction chamber provided separately from the discharge space in the processing chamber;
a substrate support configured to support the substrate in the reaction chamber;
a substrate mover configured to rotate the substrate supported by the substrate support;
a sputtered particle passage hole provided in the sputtered particle shield, having an area smaller than that of the substrate, and configured to pass the sputtered particles toward the substrate in the reaction chamber; and
a reactive gas introducing port configured to introduce a reactive gas into the reaction chamber,
wherein, the sputtered particles are released to the discharge space by the sputtering assembly while rotating the substrate by the substrate mover, ejected into the reaction chamber through the sputtered particle passage hole, and reacted with the reactive gas introduced into the reaction chamber, thereby forming a reactive sputtering film on the substrate, and
a rotational axis of the substrate mover overlaps with a central point of the sputtered particle passage hole,
the sputtered particle shield includes:
a sputtered particle shielding plate in which the sputtered particle passage hole is formed; and
a shielding member above the sputtered particle shielding plate,
the sputtered particle shielding plate includes:
a first side portion; and
a first extension portion extended from an end of the first side portion toward an outside of the discharge space,
the shielding member includes:
a second side portion disposed farther from a center of the discharge space than the first side portion; and
a second extension portion extended from an end of the second side portion toward the discharge space, the second extension portion facing the first extension portion with a gap therebetween.

2. The film forming apparatus according to claim 1, wherein the area of the sputtered particle passage hole is 90% or less of the area of the substrate.

3. The film forming apparatus according to claim 2, wherein the area of the sputtered particle passage hole is 10% to 50% of the area of the substrate.

4. The film forming apparatus according to claim 3, wherein the substrate is horizontally disposed on the substrate support,
the substrate mover rotates the substrate in a horizontal plane,
the sputtered particle shield is disposed immediately above the substrate, and
the sputtered particles and the reactive gas react with each other in a reaction space between the sputtered particle shielding plate and the substrate.

5. The film forming apparatus according to claim 4, wherein a distance between the sputtered particle shielding plate and the substrate is 2 mm or more.

6. The film forming apparatus according to claim 5, wherein the sputtered particle shielding plate functions as a rectifying plate configured to rectify the reactive gas.

7. The film forming apparatus according to claim 6, wherein the sputtering assembly includes:
a target holder configured to hold a target for releasing the sputtered particles;
a sputtering gas introducing port configured to introduce a sputtering gas into the discharge space; and
a power supply configured to apply a voltage to the target holder;

wherein the sputtering gas is dissociated around the target by applying the voltage to the target holder, and ions of the dissociated sputtering gas collide with the target to release sputtered particles.

8. The film forming apparatus according to claim 7, wherein the target holder holds the target obliquely with respect to the substrate, and the sputtered particles released from the target are obliquely irradiated to the substrate.

9. The film forming apparatus according to claim 1, wherein the substrate is horizontally disposed on the substrate support,
the substrate mover rotates the substrate in a horizontal plane,
the sputtered particle shield is disposed immediately above the substrate, and
the sputtered particles and the reactive gas react with each other in a reaction space between the sputtered particle shielding plate and the substrate.

10. The film forming apparatus according to claim 9, wherein a distance between the sputtered particle shielding plate and the substrate is 2 mm or more.

11. The film forming apparatus according to claim 9, wherein the sputtered particle shielding plate functions as a rectifying plate configured to rectify the reactive gas.

12. The film forming apparatus according to claim 1, wherein the sputtering assembly includes:
a target holder configured to hold a target for releasing the sputtered particles;
a sputtering gas introducing port configured to introduce a sputtering gas into the discharge space; and
a power supply configured to apply a voltage to the target holder;
wherein the sputtering gas is dissociated around the target by applying the voltage to the target holder, and ions of the dissociated sputtering gas collide with the target to release sputtered particles.

13. The film forming apparatus according to claim 12, wherein the target holder holds the target obliquely with respect to the substrate, and the sputtered particles released from the target are obliquely irradiated to the substrate.

14. The film forming apparatus according to claim 1, wherein the substrate mover includes a rotation shaft fixed to a center of the substrate support and a rotation drive unit rotating the rotation shaft, and
the rotational axis of the rotation shaft overlaps the central point of the sputtered particle passage hole.

15. The film forming apparatus according to claim 1, wherein the sputtered particle passage hole has a shape which is wide at the outer peripheral portion of the substrate, and narrow at a center portion of the substrate.

16. The film forming apparatus according to claim 1, wherein the first and second side portion extend along a first direction, and the first and second extension portions extend along a second direction which is orthogonal to the first direction.

17. The film forming apparatus according to claim 1, wherein a distance between the first extension portion and second extension portion is 1 mm to 2 mm.

18. A film forming method for forming a film by reactive sputtering using a film forming apparatus including:
a processing chamber in which a film forming process is performed on a substrate;
a sputtering assembly configured to release sputtered particles from a target in the processing chamber;
a sputtered particle shield configured to shield a discharge space to which the sputtered particles released by the sputtering assembly are released;
a reaction chamber provided separately from the discharge space in the processing chamber;
a substrate support configured to support the substrate in the reaction chamber;
a substrate mover configured to rotate the substrate supported by the substrate support;
a sputtered particle passage hole provided in the sputtered particle shield, having an area smaller than that of the substrate, and configured to pass the sputtered particles through toward the substrate in the reaction chamber; and
a reactive gas introducing port configured to introduce a reactive gas into the reaction chamber,
the method comprising:
rotating the substrate by the substrate mover;
releasing the sputtered particles to the discharge space by the sputtering assembly and injecting the sputtered particles to the reaction chamber through the sputtered particle passage hole while rotating the substrate by the substrate mover;
reacting the sputtered particles injected to the reaction chamber with the reactive gas introduced into the reaction chamber; and
forming a reactive sputtering film generated by the reaction on the substrate,
a rotational axis of the substrate mover overlaps with a central point of the sputtered particle passage hole,
the sputtered particle shield includes:
a sputtered particle shielding plate in which the sputtered particle passage hole is formed; and
a shielding member above the sputtered particle shielding plate,
the sputtered particle shielding plate includes:
a first side portion; and
a first extension portion extended from an end of the first side portion toward an outside of the discharge space,
the shielding member includes:
a second side portion disposed farther from a center of the discharge space than the first side portion; and
a second extension portion extended from an end of the second side portion toward the discharge space, the second extension portion facing the first extension portion with a gap therebetween.

* * * * *